United States Patent [19]

Pepper

[11] Patent Number: 4,968,907
[45] Date of Patent: Nov. 6, 1990

[54] DIGITAL DELAY GENERATOR

[75] Inventor: Brian T. Pepper, Knox County, Tenn.

[73] Assignee: EG&G Instruements, Inc., Mercer County, N.J.

[21] Appl. No.: 122,898

[22] Filed: Nov. 19, 1987

[51] Int. Cl.$^5$ .................. H03K 3/159; H03K 5/00; H03K 1/17
[52] U.S. Cl. ............................. 307/603; 307/605; 307/597; 328/55; 328/63; 328/129.1; 377/20
[58] Field of Search ............... 307/590, 592, 600, 601, 307/603, 605, 597; 328/55, 63, 129.1; 377/20

[56] References Cited

U.S. PATENT DOCUMENTS

| 4,051,390 | 9/1977 | Reeves | 328/55 |
| 4,637,018 | 1/1987 | Flora et al. | 328/55 |
| 4,737,670 | 4/1988 | Chan | 307/603 |

*Primary Examiner*—Stanley D. Miller
*Assistant Examiner*—Trong Quang Pham
*Attorney, Agent, or Firm*—Pitts and Brittian

[57] ABSTRACT

An improved digital delay generator (10) for producing an output pulse/signal a preselected time interval after an input pulse/signal. The digital delay generator (10) of the present invention includes a single auxiliary timer (24) which starts responsive to feeding an input pulse thereto. This auxiliary timer (24) is stopped in response to the first generated clock pulse occurring after the input pulse. The timer (24) is then restarted after a preselected number of cycles of the clock pulse such that the total delay between the input pulse (12) and the output pulse (36) is substantially equal to the insertion delay of the single auxiliary timer (24) plus the preselected delay of the single auxiliary timer plus the delay occasioned by the lapsing of the preselected number of cycles of the clock pulse.

3 Claims, 3 Drawing Sheets

DIGITAL DELAY GENERATOR

TECHNICAL FIELD

This invention relates to digital delay generators which are typically used for timing purposes.

BACKGROUND ART

Digital delay generators find many applications in which it is desired to produce a signal after a precise time interval following an external stimulus normally in the form of an electrical pulse. For example, these devices are used for timing pulsed lasers, in radar research and other applications requiring very precise timing. Typically, digital delay generators produce delay intervals from zero to many seconds with repeatability on the order of one part in $10^{-8}$ and incremental intervals as small as a few picoseconds (1 picosecond or "pS" is $10^{-12}$ seconds). Conventional methods for generating timing signals having this level of repeatability use an electronic timing oscillator directly controlled by a quartz crystal. Such oscillators can operate at a frequency from tens of kilohertz (1 kilohertz or "kHz" is $10^3$ cycles per second) to several hundred megahertz (1 megahertz or "MHz" is $10^6$ cycles per second). The frequency is determined primarily by the physical dimensions of the crystal. A common variation of the conventional technique uses a timing oscillator which is controlled indirectly by a crystal oscillator using a phase locked loop circuit. The timing oscillator does not have to operate at the same frequency as the crystal oscillator in a phase locked loop circuit, and accordingly, a wider choice of crystals is allowed. The time interval of the delay in both cases is generally determined by counting cycles of the timing oscillator.

In practical digital delay generators, the frequency of the timing oscillator is usually not much greater than 100 MHz to allow the use of readily available integrated circuits to count the timing oscillator cycles. Since the smallest incremental interval determinable by counting cycles is one cycle, a 100 MHz oscillator will provide incremental intervals of 10 nanoseconds (1 nanosecond is $10^{-9}$ seconds). In most digital delay generators which use this method, the timing oscillator runs continuously because it takes many cycle time intervals to start an oscillator controlled directly by a crystal. There will therefore be an indeterminacy of one clock cycle in a period between the arrival of an input pulse and the arrival of the next clock cycle and therefore the completion of the clock cycle. This indeterminacy results in undesirable time jitter of the digital delay output pulse relative to the input pulse, and necessitates jitter adjustment circuitry.

The improved digital delay generator of the present invention incorporates an interruptible ramp method of timing which is designed to overcome the problem of differential changes in timer characteristics by using only one timer instead of two. The single timer is used for both start and stop interpolation and although it is susceptible to the same long term and temperature drifts as the timers used in established methods, changes in its characteristics during a timing cycle are relatively negligible and this negligible differential reduces the cause of jitter. References are made to the interruptible "ramp" method and future references are made to one and two "ramp" method since the common method of implementing auxiliary timers incorporates the use of voltage "ramps" which are generated by charging a capacitor with a switched current source.

It is an object of the present invention to provide an improved digital delay generator circuit which does not require periodic calibration to minimize time jitter.

It is another object of the present invention to provide such a digital delay generator circuit in which time jitter does not increase when the ambient temperature of the circuit changes.

Yet another object of the present invention is to provide a simplified digital delay generator circuit capable of generating multiple delay intervals which can be readily adjusted. A useful feature of the invention is the use of a single auxiliary timer such that the minimum obtainable time between an input pulse and an output pulse ("insertion delay") is reduced by at least a factor of 2. In many applications, this is an important advantage. For example, in a known prior art implementation discussed below, the conventional two-ramp instrument has an insertion delay of 85 nS and the interruptible ramp instrument has an insertion delay of 35 nS.

DISCLOSURE OF THE INVENTION

In accordance with various features of the present invention, an improved digital delay generator is provided. The instrument produces an output pulse/signal a preselected time interval after an input pulse/signal is fed thereto. The device includes a single auxiliary timer which starts responsive to feeding the input pulse/signal into the generator. The auxiliary timer is stopped responsive to the first clock pulse generated after the input pulse is fed into the instrument. This auxiliary timer is then restarted after a preselected number of cycles of the clock pulse such that the total delay between the input pulse/signal and the output pulse/signal is substantially equal to the insertion delay of the single auxiliary timer plus the preselected delay of the single auxiliary timer plus the delay occasioned by the lapsing of the preselected number of cycles of the clock pulse.

BRIEF DESCRIPTION OF THE DRAWINGS

The above-mentioned features of the invention will become more clearly understood from the following detailed description read together with the drawings in which:

FIG. 4 illustrates waveforms pertinent to the device operation. More specifically.

BEST MODE FOR CARRYING OUT THE INVENTION

Figure 1:
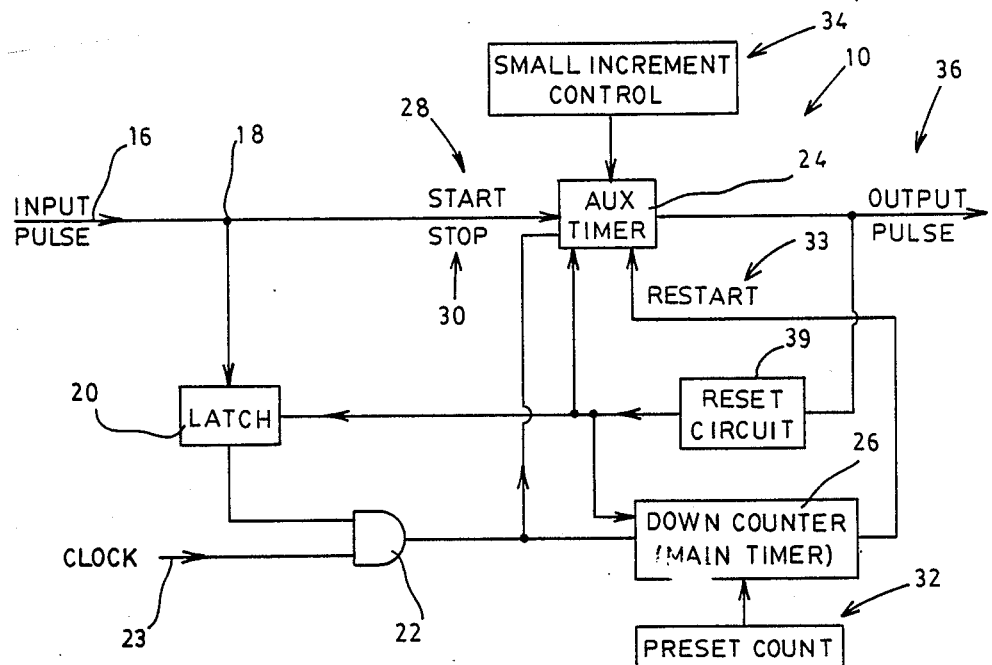
FIG. 1 illustrates a block diagram of an improved digital delay generator incorporating the interruptible ramp technique of the present invention.
Figure 3:
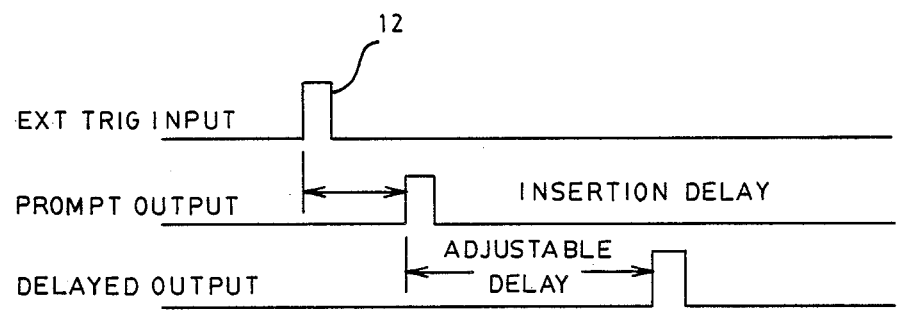
FIG. 3 depicts an externally generated trigger or input pulse; the insertion delay of a prompt output; and the adjustable delay in the delayed output occasioned by a digital delay generator.

A digital delay generator incorporating various features of the present invention is illustrated generally at 10 in the block diagram of FIG. 1. The digital delay generator 10 is designed to receive an input pulse 12 (see FIG. 3) generated by an external pulse generator of conventional design. This input pulse is referred to as the external trigger input ("EXT TRIG INPUT") in FIG. 3. The input pulse 12 is fed to lead 16 shown in FIG. 1. The pulse travels to node 18 where it enters the latching circuit 20 of conventional design and prevents any subsequent input pulse prior to the completion of the timing cycle from having any effect on the digital delay generator. Moreover, the latching circuit 20 remembers an input pulse has occurred even though it may be short. The output of the latching circuit is fed to the AND gate 22. The AND gate prevents clock pulses fed into lead 23 from starting the main counter, which will be described in greater detail below, until an input pulse 12 has been accepted. The clock pulse is generated by a crystal controlled oscillator of conventional design.

The auxiliary timer 24 is started immediately by the input pulse 12 fed to lead 16 and through node 18. This auxiliary timer stops at the time the first clock pulse appears after the input pulse appeared. It will also be noted that at the time the first clock pulse appears after the input pulse appeared, the main timer 26 is started. This is caused by the output of the AND gate 22 following the clock cycles as long as the latch is set.

Thus, the auxiliary timer 24 now contains information which is proportional to the difference between the time of occurrence of the input or start pulse indicated at 28 and the time of occurrence of the first following clock pulse which serves as the stop pulse indicated at 30. When the auxiliary timer is subsequently restarted after the preset number of counts in the main timer have elapsed, it will run for the remainder of the time needed to provide the total delay determined by the small increment control set by the user. If more than one interval is required to be generated following the input pulse, a separate clock cycle counter and a separate small increment control can be added for each additional interval. The single auxiliary counter can be restarted and stopped to serve at least four intervals.

The main or down counter 26 runs for a preselect number of counts as is determined by the user such that he can make coarse adjustments to the total time. That time together with the delay produced by the auxiliary timer establishes the interval of the delay desired to be produced by the digital delay generator 10. The main timer can be implemented by several conventional techniques using a combination of high speed and medium speed counting devices with/without computer control capability. Typical devices are Motorola type MC 10131, Fairchild type 74F161 and Intel type 8254 chips. Corresponding manufacturers' application notes on synchronous counters can be consulted for greater detail.

Similarly, the auxiliary timer 24 operates on a conventional principle employed in commercially available monolithic devices such as the Type 555 timer available from National Semiconductor Corporation and other manufacturers. These timers are started by input pulses for which the total time that elapses before an input pulse appears can be continuously varied by a control voltage. In the preferred embodiment, discrete components are used instead of an integrated circuit and parts are chosen to allow the higher speed of operation required. Additionally, means are provided to stop, and, in the case of the interruptible ramp method illustrated in FIG. 1, restart the ramp which the circuit generates before the cycle is complete as will be more clearly understood below.

The down counter 26, as described above, will run for a preset number of counts determined by the user. In the particular instrument employing the circuitry 10, the preset number of counts as well as the small increment control is determined by the user having a key pad of conventional design (not shown) on the front panel of an instrument employing the interruptible ramp technique. This preset control is illustrated diagrammatically at 32 in FIG. 1. This control as well as the small increment control can also be controlled remotely by an external computer system. When the preset number of counts has elapsed, the auxiliary timer 24 then restarts, as indicated at 33, and runs until it hits a predetermined level set by the small increment control illustrated diagrammatically at 34. This control 34 adjusts the preset levels V2 in FIG. 4. Upon the occurrence of this condition, the circuitry 10 produces an output pulse 36. The output pulse 36 drives a reset circuit 39 which serves to re-initialize all elements in readiness for a new input.

The total difference, i.e., the total lapsed time between the input pulse 12 and the output pulse 36, comprises the delay produced by the instrument. In a system incorporating the interruptible ramp method employed by the circuitry 10 of the digital delay generator, the delay between the input pulse 12 and the output pulse 36 is both accurate and repeatable. It will be noted that the delay time in the digital delay generator 10 is determined in part by a combination of the preset count 32 in the down counter 26 and the small increment control 34 fed into the auxiliary timer 24. For example, in one embodiment constructed in accordance with various features of the present invention, the crystal clock fed to lead 23 runs at 50 MHz such that the smallest increments which can be inserted by adding counts to the down counter is 20 nanoseconds; and the small increment control therefore is used to allow small fractions of 20 nanoseconds to be inserted in the main delay interval.

A known technique which incorporates two auxiliary timing circuits solves the problem of the one cycle indeterminacy and also produces smaller incremental intervals. In the prior art circuitry 35 (see FIG. 2), the first auxiliary circuit 62, labeled AUX 1 TIMER, is used to effectively measure the time between the arrival of the input pulse and the arrival of the next clock cycle. A second auxiliary timer 64, labeled AUX 2 TIMER, is partially controlled by the first auxiliary timer to compensate for differing arrival times of the external stimulus relative to the clock and partially controlled to allow small increments of time to be selected. If more than one precise time interval is required to be generated following the input pulse, a separate clock cycle counter and a separate second auxiliary counter can be added for each additional interval.

Figure 2:
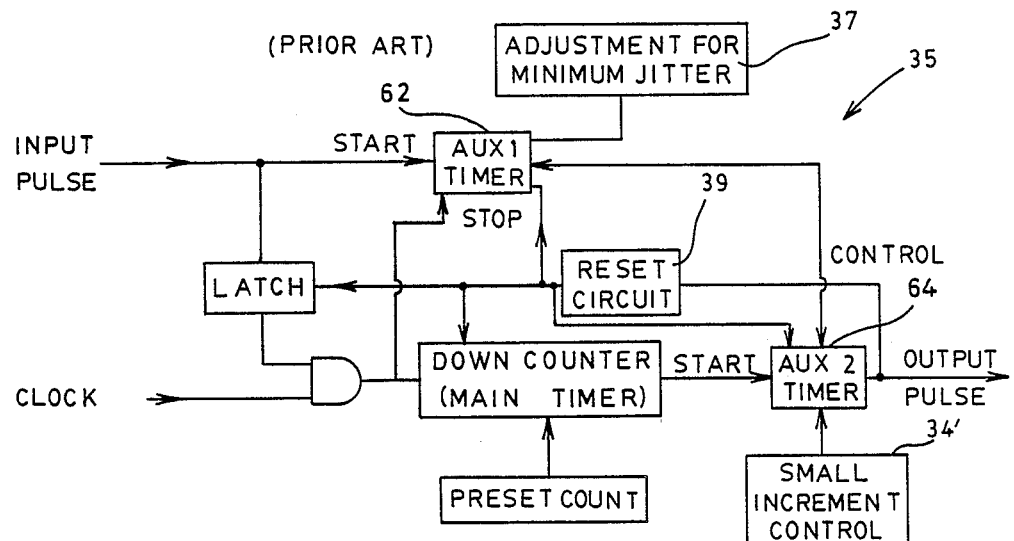
FIG. 2 illustrates a block diagram of a prior art device incorporating a plurality of auxiliary timers.

This prior art circuitry shown in FIG. 2 works well so long as the two auxiliary timers 62, 64 are identical, but if they become dissimilar (due, for example, to changes in temperature affecting one timer differently from the other or over a long period because of some components in one timer age at a different rate than components in the other), the time jitter resulting from the one cycle indeterminacy is not completely removed. This requires a jitter control 37 which assists in controlling the AUX 1 TIMER 62. The reason for this is explained in greater detail in reference to FIG. 4. The "small increment control" 34 is similar to 34' shown in FIG. 2 and serves to adjust the preset level shown in FIG. 4C.

Certain features of the present invention will be more apparent upon reviewing FIG. 4 and the various waveforms represented therein. FIG. 4 also serves to delineate the differences between the waveforms produced by the prior art circuitry 35 of FIG. 2 and the circuitry incorporating various features of the present invention shown at 10 in FIG. 1. More particularly, FIG. 4A represents the input pulse 12 and the delayed output pulse 36 FIG. 4B (as solid lines) represents "clock example 1" and the phantom or broken lines illustrate "clock example 2" having a shifted phase. FIG. 4C illustrates the voltage waveform for a two-ramp method which is known in the prior art; and FIG. 4D represents the voltage waveform for the interrupted ramp method incorporating and describing various features of the present invention. The object lines in FIGS. 4C and 4D represent timer responses to the clock example 1, and the broken lines in these figures represent timer responses to clock example 2 having a shifted phase.

Figure 4A:
FIG. 4A illustrates the input and delayed output waveforms.
Figure 4B:
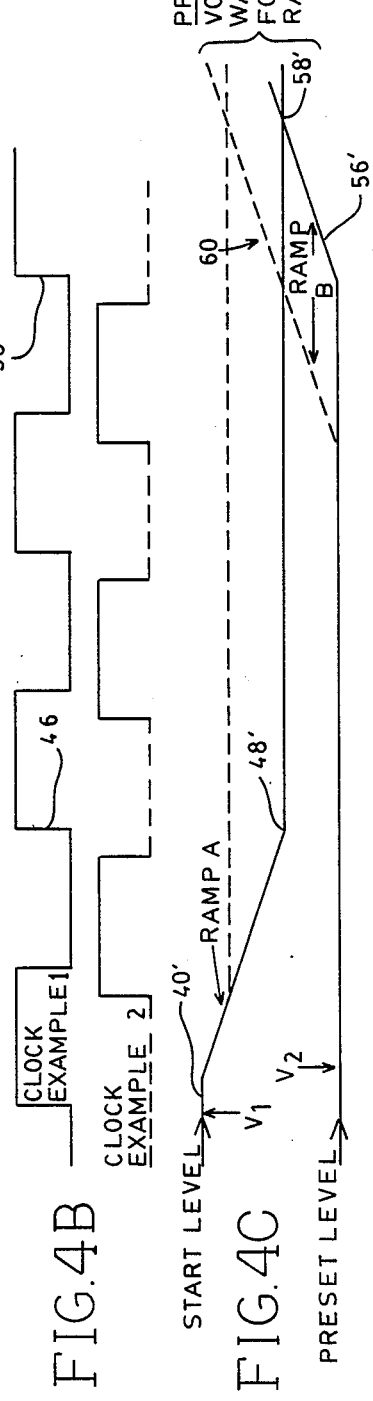
FIG. 4B illustrates two examples of clock waveforms.
Figure 4C:
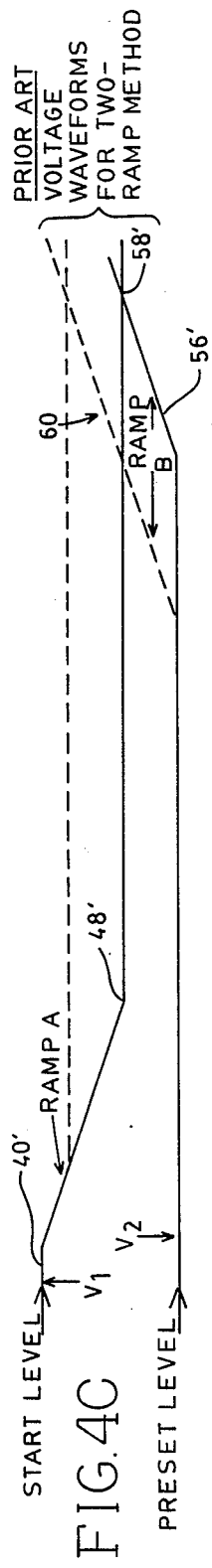
FIG. 4C illustrates voltage waveforms, for the two ramp method, which are generated in the auxiliary timers of conventional devices.
Figure 4D:
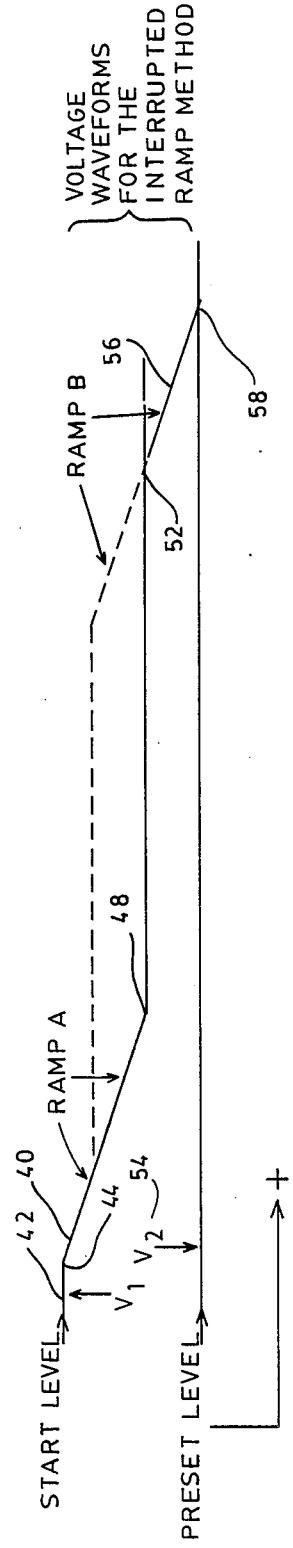
FIG. 4D illustrates the voltage waveforms for the interrupted ramp method technique.

Coincident with the input pulse 12, ramp A indicated at 40 starts, as is shown in FIG. 4D which represents the interrupted ramp method. It will be noted that upon the occurrence of the input pulse 12, ramp A immediately begins to depart from the start level depicted at 42. The departure is illustrated at 44. As soon as the first rising edge of clock pulse of example 1 occurs, as is shown at 46 in FIG. 4B, the ramp A stops, as indicated at 48. When the preset number of clock pulses set by a preset count 32 has elapsed (in this example, 2 complete cycles as illustrated between leading edges 46 and 50 of the clock pulse) the ramp A starts again as is indicated at 52. This ramp, which is referred in the drawing as ramp B, illustrated at 56, runs until the ramp voltage is equal to the preset level voltage V2 depicted at 54. This point is depicted at 58 and at this time, the output pulse 36 is generated as shown in FIG. 4A.

Since the input pulse 12 and the crystal clock pulses are not synchronous by definition, the input pulse can occur at any time and at any phase. As mentioned generally above, two examples are shown in FIG. 4B. The solid line example is the one which has just been described, and the other example illustrated by clock example 2 is shown by the broken lines. Referring to FIG. 4D which depicts the voltage waveform for the interrupted ramp method which corresponds with the circuit diagram 10, the broken lines on FIG. 4D correspond with the clock example 2 depicted in the broken line on FIG. 4B. The only difference between the solid and the broken lines is one of phase. There are of course an essentially infinite number of possible phases which the clock has with respect to the input. However, ramp B for the interrupted ramp technique always crosses the preset level depicted at 54 at the same time, as is illustrated by the dotted lines in FIG. 4D.

In the conventional technique depicted in FIG. 2 and having a voltage waveform shown in FIG. 4C, ramp A starts essentially at the same time ramp A starts for the interrupted ramp technique and is shown at 40'. It stops at the first occurrence of the rising edge of the clock 46 as illustrated at 48'. But in the conventional technique, a separate ramp B depicted at 56' starts after the preselected number of clock pulses has expired (here two pulse cycles between clock pulse edges 46 and 50). This separate ramp 56' runs from the preset level V2 until it crosses the voltage level 58' at which the ramp A previously stopped as depicted at 48'. At this point, the output pulse 36 is produced.

The essence of the difference between the conventional technique shown in FIG. 4C and the interrupted ramp technique shown in FIG. 4D, can in part be determined by viewing the ramps reflected by the broken lines in FIG. 4C corresponding to clock example 2, which is the phantom line or broken line in FIG. 4B. Different portions of ramp A and ramp B are used in determining total time where the phase of the clock pulse varies as is shown at 60. If the slopes of the ramps A and B are identical, differences in the portions of ramps A and B used to determine the total time will have no effect on the time of occurrence of the output pulse. However, if the ramps slopes are different, then there will be a change in the time at which the output pulse occurs relative to the input pulse. This difference will be a function of the phase of the clock at the time of arrival of the input pulse. Such differences in the slope of the two-ramp or conventional method are to be expected as time elapses, (hours, days, weeks) and as the temperature of the circuitry changes because of differences in component temperature coefficients and because of the aging of the components. While these differences are not exaggerated in the drawing of FIG. 4C, those skilled in the art will recognize that differences in the ramps at B will occur where different auxiliary timers are used.

However, in the interrupted ramp method, changes between the occurrence of ramp A and ramp B are limited to the time period elapsing therebetween which varies with the selected number of clock pulses. This period is obviously short relative to the hours, days and week which can have an effect on the two ramps of the conventional system. At most, the time variation of circuitry 10 involves a period of a second or so. Thus, the slope of ramp A is very close to the slope of ramp B in all circumstances and differences in proportions of ramp A and ramp B contributing to the total delay time will have relatively no effect on the output pulse. The conventional two-ramp method attempts to adjust for variations in the slope of ramp A and ramp B with the jitter adjustment. This jitter adjustment 37 serves to attempt to make either ramp A or ramp B identical to the other.

From the foregoing detailed description, it will be appreciated that an improved digital delay generator has been described and illustrated. More specifically, the digital delay generator of the present invention does not require periodic calibration to minimize time jitter. Further, time jitter complications are not increased when the ambient temperature of a circuit changes due to the relative small time within which jitter problems can develop. The circuit is capable of generating multiple delay intervals by making preselected preset count adjustments and small increment control adjustments. Further, the circuitry is less expensive to construct due to the elimination of one auxiliary timer required in prior art devices.

While a preferred embodiment has been shown and described, it will be understood that there is no intent to limit the invention to such disclosure, but rather it is intended to cover all modifications and alternate constructions falling within the spirit and scope of the invention in the appended claims.

I claim:

1. An improved digital delay generator which produces an output pulse/signal at a preselected time interval after an input pulse/signal is fed thereto, said generator comprising:
- a single auxiliary timer for receiving said input pulse/signal, said auxiliary time being started upon receipt of said input pulse/signal;
- a clock means for generating a series of clock pulses;
- gating circuit means connected to said clock means and said auxiliary timer for outputting clock pulses from said clock means said auxiliary timer for stopping said auxiliary timer responsive to a first of said series sets of clock pulses generated after said input pulse/signal;
- main timer means connected to said gating circuit means and said auxiliary timer for restarting said auxiliary timer after a preselected number of cycles of said clock pulses; and
- small increment control means connected to said auxiliary means to control duration of running time of said auxiliary timer to produce an insertion delay when by the delay between said input pulse/signal and said output pulse/signal of said digital delay generator is substantially equal to said insertion delay of said auxiliary timer plus a preselected delay occasioned by the lapsing of said preselected number of cycles of said clock pulses as determined by said main timer means.

2. The improved digital delay generator of claim 1 including latching circuit means connected for receiving said input pulse/signal and for outputting a logic level voltage signal to said gating circuit in response to said input pulse/signal, said latching circuit means serving to prevent any subsequent input pulse/signal which may occur prior to completion of a timing cycle of said generator from having any effect on said generator.

3. An interruptable ramp digital delay generator which produces an output pulse/signal at preselected time interval after receipt of an input pulse/signal, said generator comprising:
- latching circuit means connected to receive said input pulse/signal and operative in response to said input pulse/signal to prevent any subsequent input pulse/signal which occurs prior to completion of the timing cycle of said generator from having any effect on said generator;
- a clock means for generating a series of clock pulses;
- main timer circuit means connected to said clock means for producing a first output pulse in response to a first of said clock pulses aft said input pulse/signal first appears and a second output pulse after a selected number of clock pulses;
- and a single auxiliary timer means for receiving said input pulse/signal, said auxiliary timer means being connected to said main timer circuit means, said auxiliary timer means being started by said first output pulse from said main timer circuit means at the time a first of said clock pulses appears after said input pulse signal has first appeared, said auxiliary timer being restarted by said second output pulse of said main timer circuit means after the lapse of a preselected number of cycles of said clock pulses to produce said output pulse/signal of said generated whereby the delay between said input pulse/signal to said generator and said output pulse/signal from said generator is substantially equal to an insertion delay of said auxiliary timer means plus a delay occasioned by the lapsing of said preselected number of cycles of said clock pulses.

* * * * *